United States Patent [19]

Ikawa et al.

[11] Patent Number: 5,395,792
[45] Date of Patent: Mar. 7, 1995

[54] PROCESS FOR FABRICATING A SEMICONDUCTOR LASER DEVICE

[75] Inventors: Katsuhiko Ikawa; Hiroshi Matagi, both of Kyoto, Japan

[73] Assignee: Rohm Co., Ltd., Kyota, Japan

[21] Appl. No.: 252,349

[22] Filed: Jun. 1, 1994

[30] Foreign Application Priority Data

Jun. 2, 1993 [JP] Japan ................................. 5-132167
Aug. 25, 1993 [JP] Japan ................................. 5-210542

[51] Int. Cl.6 ............................................. H01L 21/20
[52] U.S. Cl. ............................. 437/129; 148/DIG. 95
[58] Field of Search ................ 437/129; 148/DIG. 95

[56] References Cited

U.S. PATENT DOCUMENTS

| 4,567,060 | 1/1986 | Hayakawa et al. | 437/129 |
| 4,734,385 | 3/1988 | Mihashi et al. | 437/129 |
| 4,855,250 | 8/1989 | Yamamoto et al. | 437/129 |
| 5,153,148 | 10/1992 | Sakiyama et al. | 148/DIG. 95 |
| 5,268,328 | 12/1993 | Mori et al. | 437/129 |

FOREIGN PATENT DOCUMENTS 227179 12/1984 Japan ................................. 437/129

Primary Examiner—R. Bruce Breneman
Assistant Examiner—Linda J. Fleck
Attorney, Agent, or Firm—Nikaido, Marmelstein, Murray & Oram

[57] ABSTRACT

There is provided a process for fabricating a highly reliable semiconductor laser device operable at a low current with an increased yield, which process includes the steps of: (a) forming a lower clad layer on a semiconductor substrate; (b) forming an active layer of a material larger in refractive index and smaller in forbidden band width than the lower clad layer; (c) forming a first upper clad layer of a material smaller in refractive index and larger in forbidden band width than the active layer; (d) forming an etch stop layer made of GaAs on the first upper clad layer; (e) forming a current-blocking layer of a material smaller in refractive index and larger in forbidden band width than the first upper clad layer; (f) forming a stripe cavity by etching at least a portion of the current-blocking layer down to the etch stop layer; (g) evaporating the etch stop layer remaining in the stripe cavity; (h) forming a second upper clad layer of a material smaller in refractive index and larger in forbidden band width than the active layer while larger in refractive index and smaller in forbidden band width than the current-blocking layer; and (i) forming a contact layer of a material larger in refractive index and smaller in forbidden band width than the active layer.

7 Claims, 4 Drawing Sheets

PROCESS FOR FABRICATING A SEMICONDUCTOR LASER DEVICE

BACKGROUND OF THE INVENTION

The present invention relates to a process for fabricating a low operating current semiconductor laser device and, more particularly, to a process for fabricating such a laser device which uses an indirect transition material absorbing a small quantity of light for the current-blocking layer of the semiconductor laser device to reduce the operating current thereof while allowing precise etching of the current-blocking layer with the clad layer thereof prevented from oxidizing.

Nowadays, semiconductor laser devices are being widely used as light source of optical information equipment. Among these, semiconductor laser devices for use in portable-type CD players, MD players or the like are desired to operate at a low current in view of the life of a battery used therein.

There has been reported at, for example, an autumn meeting of Japanese Applied Physics Society, 17a-v-1 in 1992, a semiconductor laser device wherein light absorption is suppressed at the current-blocking layer as one approach to reduce the operating current. A semiconductor laser device 21 shown in FIG. 3 is one example of this type.

The semiconductor laser device 21 includes, stacked sequentially on a semiconductor substrate 2 such as made of n-GaAs, a lower clad layer 3 such as made of n-$Al_xGa_{1-x}As$, an active layer. 4 such as made of $Al_yGa_{1-y}As$ (x>y), a first upper clad layer 5 such as made of p-$Al_xGa_{1-x}As$, $Al_xGa_{1-x}As$, a second upper clad layer 8 made of p-$Al_xGa_{1-x}As$, and a contact layer 9 such as made of p-GaAs. In addition, the lower surface of the semiconductor substrate 2 and the upper surface of the contact layer 9 are formed with a negative electrode 10a and a positive electrode 10b, respectively. The proportion of Al in the active layer 4 is set lower than that in the lower and upper clad layers so that the active layer would be made larger in refractive index and smaller in forbidden band width than the lower and upper clad layers. Further, an optical waveguide is provided so as not to let light produced at the active layer escape toward the clad layer, while in addition the clad layer is adapted not to absorb the light. As described in, for example, Makoto Konagai, "An introduction to superlattice", Baifukan Co., p. 28, 1978, it is known that the refractive index of $Al_qGa_{1-q}As$ increases and the forbidden band width thereof decreases with decreasing ratio q. Accordingly, appropriate selection of ratio q makes it possible to obtain desired refractive index and forbidden band width.

As shown in FIG. 3, a current-blocking layer 7, such as made of n-$Al_zGa_{1-z}As$ (z>x), formed on the first upper clad layer 5 is partially removed in a striped fashion to form a stripe cavity 11 having a width $W_1$ and a length L. Since the current-blocking layer 7 is formed of an indirect transition material, light absorption in the semiconductor laser device 21 is suppressed. Further, an optical waveguide is defined along the stripe cavity since the refractive index of the current-blocking layer is lower than that of the clad layer adjacent the stripe cavity.

One example of the process for fabricating this conventional semiconductor laser device 21 is to be described with reference to FIGS. 4(a) to 4(d).

As shown in FIG. 4(a), using an MBE system a first growth layer 20 is initially formed on a semiconductor substrate 2 of n-GaAs by sequentially stacking thereon a lower clad layer 3 of n-$Al_xGa_{1-x}As$ (x=0.60), active layer 4 of $Al_yGa_{1-y}As$ (y=0.15), first upper clad layer 5 of p-$Al_xGa_{1-x}As$, current-blocking layer 7 of n-$Al_zGa_{1-z}As$ (z=0.75) and surface-protective layer 12 of non-doped GaAs.

In turn, as shown in FIG. 4(b), a stripe cavity 11 is defined by covering the surface-protective layer 12 with a photoresist film 14 except for the region dedicated to the stripe cavity 11 and etching that region down to the lower surface of the current-blocking layer 7 through the surface-protective layer 12 and current-blocking layer 7 with a sulfuric acid-based etchant using the photoresist film 14 as a mask.

The resulting structure is subsequently placed in the MBE system again, then heated at about 740° C. while irradiated with arsenic molecular beam as shown in FIG. 4(c).

In general, as the temperature rises, the evaporation rate of GaAs increases. However, the evaporation rate of AlGaAs varies little. Accordingly, when the temperature rises, the surface-protective layer 12 of GaAs is evaporated while the first upper clad layer 5 and current-blocking layer 7 are evaporated little. Thus, the surface-protective layer 12 can be removed without affecting the first upper clad layer 5 and current-blocking layer 7.

In turn, the temperature of the semiconductor substrate 2 being kept at about 600° C., a second upper clad layer 8 of p-$Al_xGa_{1-x}As$ and a contact layer 9 of p-GaAs are sequentially deposited on the substrate thus processed by MBE process as shown in FIG. 4(d).

Finally, the lower surface of the semiconductor substrate 2 is lapped, followed by forming a positive electrode 10b connecting to the contact layer 9 and a negative electrode 10a connecting to the semiconductor substrate 2. Thus, the semiconductor laser device 21 shown in FIG. 3 is completed.

With such a conventional process, however, the formation of the stripe cavity is performed by chemical etching and, hence, an etching depth cannot accurately be controlled. This causes a problem that even the active layer is undesirably etched by too much etching or that the current-blocking layer is left too much by insufficient etching to inhibit current from flowing. In addition, the current-blocking layer and clad layer are of mixed crystal having a relatively high Al ratio and hence are likely to be oxidized during the chemical etching. This can be a factor of degraded device reliability.

It is, therefore, an object of the present invention to overcome the foregoing probolems and to provide a process for fabricating a semiconductor laser device operable at a low current with a high yield and a good mass productivity.

SUMMARY OF THE INVENTION

Accordingly, the present invention provides a process for fabricating a semiconductor laser device, comprising the steps of:
 (a) forming a lower clad layer of a first conductivity type on a semiconductor substrate of the first conductivity type;
 (b) forming an active layer on the lower clad layer, the active layer being made of a material larger in refractive index and smaller in forbidden band width than the lower clad layer;

(c) forming a first upper clad layer of a second conductivity type on the active layer, the first upper clad layer being made of a material smaller in refractive index and larger in forbidden band width than the active layer;

(d) forming an etch stop layer made of a material which is evaporated at a rate larger than said first upper clad layer on the first upper clad layer;

(e) forming a current-blocking layer of the first conductivity type on the etch stop layer, the current-blocking layer being made of a material smaller in refractive index and larger in forbidden band width than the first upper clad layer;

(f) forming a stripe cavity by etching at least a portion of the current-blocking layer down to the etch stop layer;

(g) evaporating the etch stop layer remaining in the stripe cavity;

(h) forming a second upper clad layer of the second conductivity type on the current blocking layer and the stripe cavity, the second upper clad layer being made of a material smaller in refractive index and larger in forbidden band width than the active layer while larger in refractive index and smaller in forbidden band width than the current-blocking layer; and (i) forming a contact layer of the second conductivity type on the second upper clad layer, the contact layer being made of a material larger in refractive index and smaller in forbidden band width than the active layer.

It is preferable that said etch stop layer is performed in a MBE apparatus.

It is preferable that said first upper clad layer is made of $Al_xGa_{1-x}As$ ($0.35 \leq x \leq 0.7$), said etch stop layer is made of GaAs, said current blocking layer is made of $Al_zGa_{1-z}As$ ($z > x$, $0.45 \leq z \leq 0.8$).

It is preferable to further include a step of forming a surface-protective layer prior to be etched after froming said current blocking layer.

The process for fabricating a semiconductor laser device of claim 4, wherein said surface-protective is made of the same material as said current blocking layer.

It is preferable that said first upper clad layer is made of $Al_xGa_{1-x}As$ ($0.35 \leq x \leq 0.7$), said etch stop layer is made of GaAs, said current blocking layer is made of $Al_zGa_{1-z}As$ ($z < x$, $0.45 \leq z \leq 0.8$), wherein said surface protective layer is made of GaAs.

It is preferable that said surface protective layer is completely evaporated when said etch stop layer is evaporated.

In the process of the present invention the provision of the etch stop layer between the first upper clad layer and the current-blocking layer always allows etching to be accurately controlled because the depth of etching is defined thereby. In addition, the etch stop layer remaining in the stripe cavity can be evaporated in an MBE system and, hence, the first upper clad layer in the stripe cavity will never be oxidized. This means that the etch stop layer also serves as an oxidation-preventive layer. As a result, a highly reliable semiconductor laser operable at a low operation current is obtained with a high yield.

DETAILED DESCRIPTION

The present invention will now be described in detail with reference to the drawings.

Figure 1:
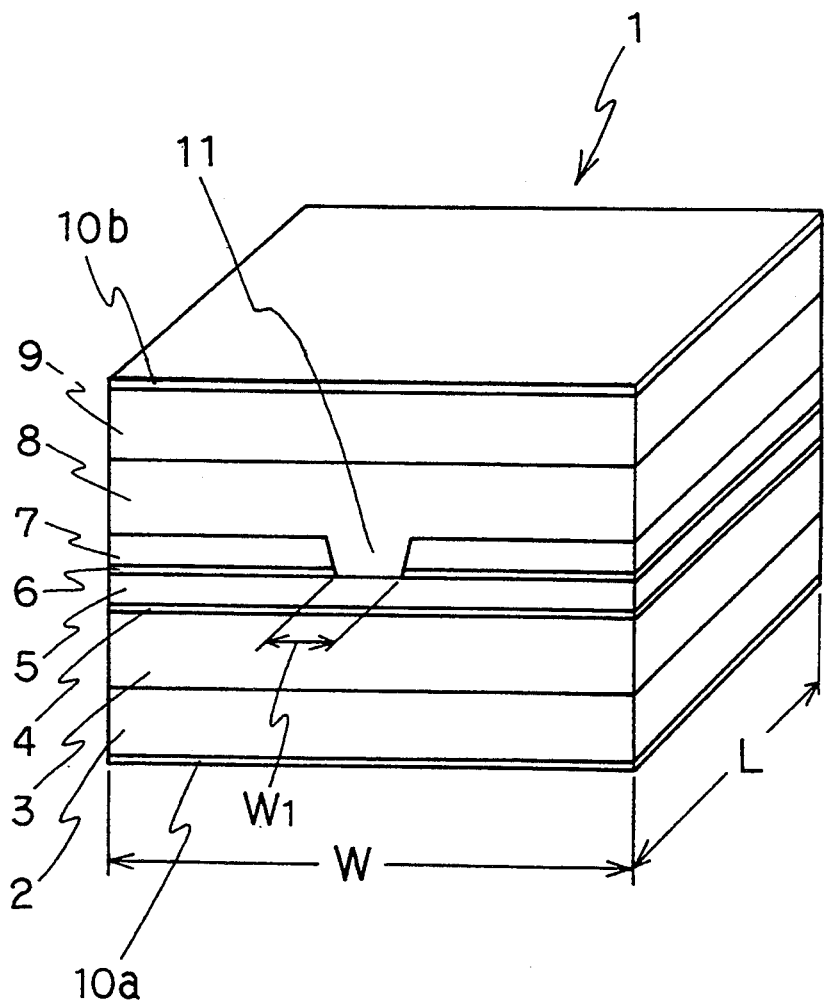
FIG. 1 is an explanatory sectional view showing one embodiment of a semiconductor laser device according to the present invention.

Referring initially to FIG. 1, a semiconductor laser 1 includes, sequentially stacked on a semiconductor substrate 2 of a first conductivity type such as made of GaAs, a lower clad layer 3 of the first conductivity type such as made of $Al_xGa_{1-x}As$ ($0.35 \leq x \leq 0.7$), an active layer 4 either non-doped or of a first or second conductivity type such as made of $Al_yGa_{1-y}As$ ($y \leq 0.2$, $y < x$), the active layer 4 being larger in refractive index and smaller in forbidden band width than the lower clad layer 3, a first upper clad layer 5 of the second conductivity type such as made of $Al_xGa_{1-x}As$, the first upper clad layer 5 being smaller in refractive index and larger in forbidden band width than the active layer 4, an etch stop layer 6 of the first conductivity type such as made of GaAs, a current-blocking layer 7 of the first conductivity type such as made of $Al_zGa_{1-z}As$ ($0.45 \leq z \leq 0.8$, $x < z$), the current-blocking layer 7 being smaller in refractive index and larger in forbidden band width than the first upper clad layer 5, a second upper clad layer 8 of the second conductivity type such as made of $Al_xGa_{1-x}As$, the second upper clad layer 8 being smaller in refractive index and larger in forbidden band width than the active layer 4 while larger in refractive index and smaller in forbidden band width than the current-blocking layer 7, and a contact layer 9 of the second conductivity type such as made of GaAs, the contact layer 9 being larger in refractive index and smaller forbidden band width than the active layer 4. In addition the semiconductor laser 1 is provided with electrodes 10a and 10b on the lower surface of the semiconductor substrate 2 and on the contact layer 9, respectively. As described earlier, it is known that $Al_qGa_{1-q}As$ increases in refractive index and decreases in forbidden band width with decreasing Al ratio q and, hence, appropriate selection of the ratio q makes it possible to establish a desired relationship among the layers of the stacked structure.

A stripe cavity 11 having a width $W_1$ of about 1 μm to about 2 μm extends centrally of the current-blocking layer 7 and etch stop layer 6 to define an optical waveguide therealong. The etch stop layer 6 will not affect the optical effects of the laser 1 because of its very small thickness, 100 Å to 200 Å. Further, since the active layer 4 is sandwiched by the clad layers which are smaller in refractive index and larger in forbidden band width than the active layer 4, light generated at the active layer 4 is confined and is not absorbed by the clad layers.

The semiconductor laser according to the present invention is characterized by the provision of the etch stop layer 6 between the current-blocking layer 7 and the first upper clad layer 5. Even if the etch stop layer 6 is only about 100 Å to about 200 Å thick, it sufficiently achieve the effect of preventing the first upper clad layer from being etched due to too much etching or being exposed and oxidized.

It should be noted that "first conductivity type" and "second conductivity type" are herein meant by n-type or p-type conductivity of a semiconductor and p-type or n-type conductivity thereof, respectively. Accordingly, if the first conductivity type is n-type, the second conductivity type is p-type, and vice versa.

To be described next with reference to FIGS. 2(a) to 2(d) are each an example of a process for fabricating a semiconductor laser according to the present invention.

Figure 2A:
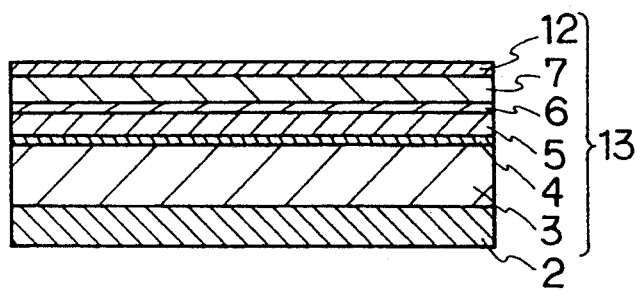
FIGS. 2(a) to 2(d) are each a schedule drawing illustrating one example of a process for fabricating a semiconductor laser device according to the present invention.

First, a semiconductor substrate 2 of a first conductivity type such as made of GaAs is placed within an MBE apparatus. Then, as shown in FIG. 2(a), on the semiconductor substrate 2 there is formed a first growth layer 13 by sequentially depositing thereon by molecular beam epitaxy a 7000 Å to 30000 Å thick lower clad layer 3 of the first conductivity type such as made of $Al_xGa_{1-x}As$ ($0.35 \leq x \leq 0.07$), a 400 Å to 1000 Å thick active layer 4 either non-doped or of a first or second conductivity type such as made of $Al_yGa_{1-y}As$ ($y < x$, $y \leq 0.2$), a 1000 Å to 1500 Å thick first upper clad layer 5 of the second conductivity type such as made of $Al_xGa_{1-x}As$, a 100 Å to 200 Å thick etch stop layer 6 of the first conductivity type made of GaAs, a 4000 Å to 10000 Å thick current-blocking layer 7 of the first conductivity type such as made of $Al_zGa_{1-z}As$ ($z > x$, $0.45 \leq z \leq 0.8$), and a 100 Å to 400 Å thick, non-doped, surface-protective layer 12 such as made of GaAs.

The MBE process used in the present invention may be implemented in a conventionally known manner. For instance, each source material, such as Ga, accommodated as an evaporation source in a melting pot on a crucible is evaporated in the form of molecular beam and monitored with a mass spectrometer while controlling the temperature of each evaporation source and a shutter for each source by means of a computer (not shown), whereby a compound semiconductor of a desired composition can be epitaxially grown. Thus, the ratio of Al in each layer can be adjusted with ease, so that semiconductor layers are easily formed as having the aforementioned relationship in terms of refractive index and forbidden band width among themselves.

Figure 2B:
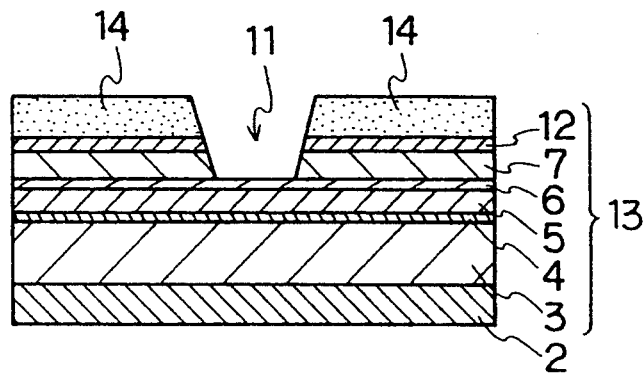

In turn, as shown in FIG. 2(b), the surface protective layer 12 covered with a photoresist film 14 except for the region dedicated to the formation of a stripe cavity 11. Using the photoresist film 14 as a mask, the surface-protective layer 12 and the current-blocking layer 7 are etched with use of an etchant capable of etching both of the layers to such an extent that the current-blocking layer is retained as having an appropriate thickness. Thereafter, the current-blocking layer 7 thus retained is selectively etched until the etch stop layer 6 is exposed using a etchant capable of selectively etching the current-blocking layer only, thus forming the stripe cavity 11. Etchants for use as the etchant capable of etching both the surface-protective layer and the current-blocking layer are, for example, sulfuric acid based etchants. On the other hand, etchants for use as the etchant capable of selectively etching the current-blocking layer are hydrofluoric acid based etchants and the like. The use of these two kinds of etchants in the order described above allows selective etching of AlGaAs and GaAs and of AlGaAs only, with the result that the surface-protective layer and the current-blocking layer are etched to define the stripe cavity 11 while the thin etch stop layer of about 100 Å to about 200 Å thickness remains unetched.

Figure 2C:
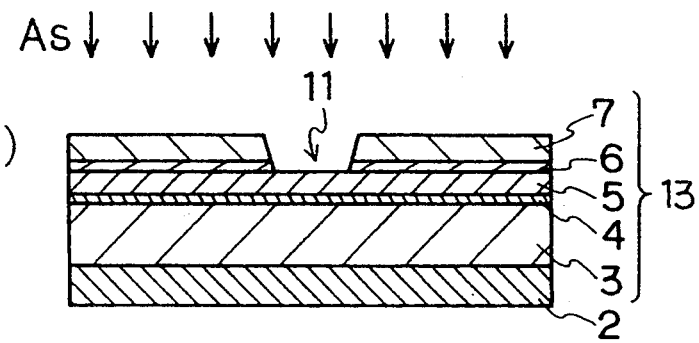

Subsequently, as shown in FIG. 2(c), the semiconductor substrate 2 thus processed placed in the MBE apparatus again and heated to about 740° C. While being heated, the surface-protective layer 12 and the etch stop layer 6 exposed at the preceding step shown in FIG. 2(b) are irradiated with arsenic molecular beam so as to be evaporated. In this case, with increasing temperature the evaporation rate of GaAs increases whereas that of AlGaAs varies little, so that only the GaAs layer is selectively evaporated.

Figure 2D:
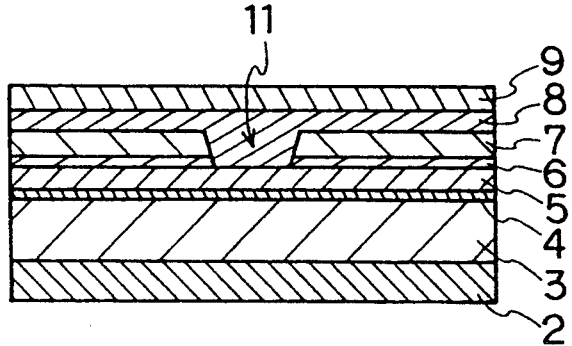
Figure 3:
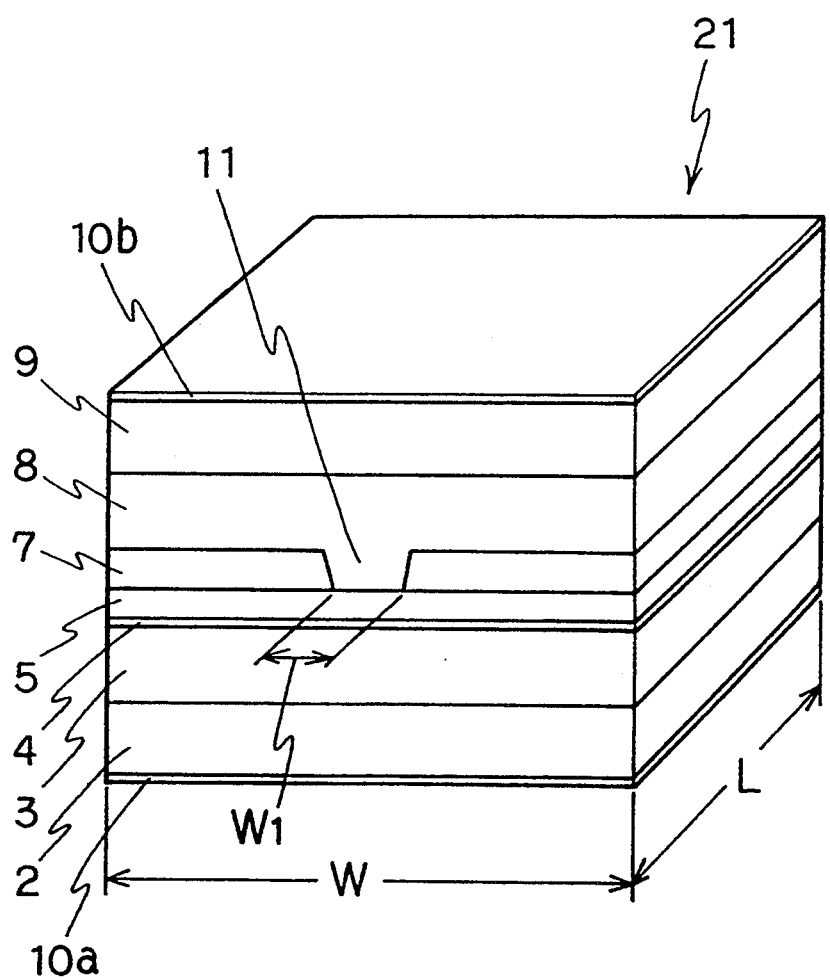
FIG. 3 is an explanatory sectional showing one example of a conventional semiconductor laser device.
Figure 4A:
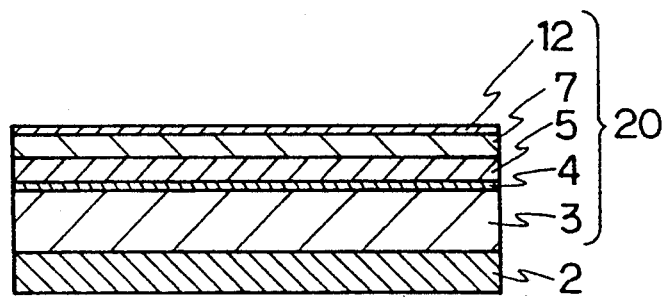
FIGS. 4(a) to 4(d) are each a schedule drawing illustrating a conventional process for fabricating a semiconductor laser device.
Figure 4B:
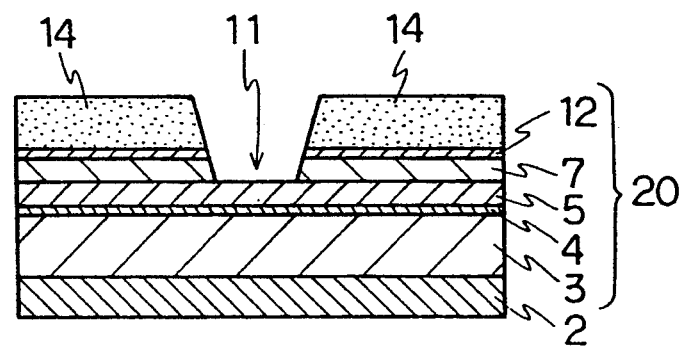
Figure 4C:
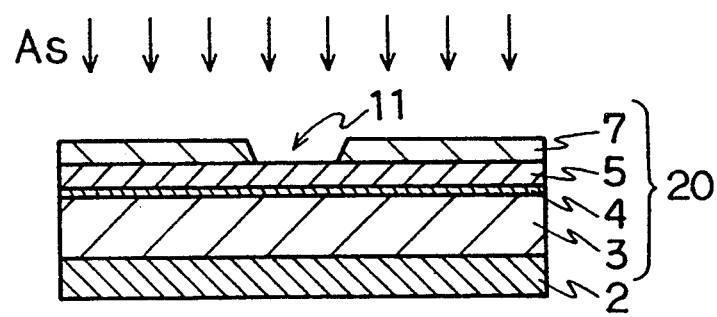
Figure 4D:
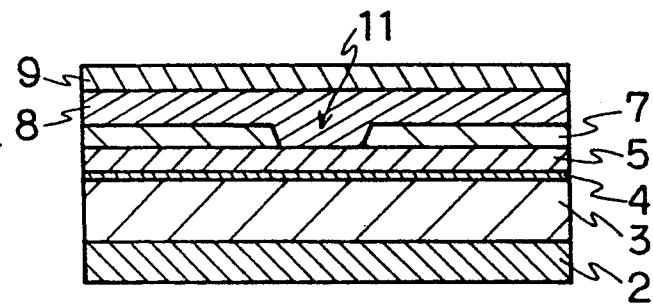

In turn, as shown in FIG. 2(d), on the current-blocking layer 7 and stripe cavity 11 there are sequentially deposited a second upper clad layer 8 of the second conductivity type such as made of $Al_xGa_{1-x}As$ and a contact layer 9 of the second conductivity type such as made of GaAs.

Finally, the reverse surface of the semiconductor substrate 2 thus formed with the semiconductor lasers is lapped, and then the resulting structure is provided with electrodes 10a and 10b on the upper and lower surfaces thereof, respectively, followed by cleaving to complete a semiconductor laser chip having a width W and a length L as shown in FIG. 1.

In the above example the relationship in terms of refractive index and forbidden band width among the lower clad layer 3, first and second upper clad layers 5 and 8, current-blocking layer 7 and contact layer 9 is established by varying the ratio q of $Al_qGa_{1-q}As$ for each layer. Nevertheless, another semiconductor material such as an InAlGaAs type material may be used to provide an efficient semiconductor laser device as far as the above-mentioned relationship in terms of refractive index and forbidden band width among layers is established. Therefore, in this case too, the provision of the etch stop layer according to the present invention will assure the production of a highly reliable semiconductor laser device with a high yield.

The process of the present invention will be described in more detail by way of a specific example.

EXAMPLE 1

On a semiconductor substrate 2 of n-GaAs there were sequentially deposited using a well-known MBE apparatus a lower clad layer 3 of $n-Al_{0.6}Ga_{0.4}As$ as having a thickness of about 20000 Å, an active layer of non-doped $Al_{0.15}Ga_{0.85}As$ as having a thickness of about 500 Å, a first upper clad layer 5 of $p-Al_{0.6}Ga_{0.4}As$ as having a thickness of about 1000 Å, an etch stop layer 6 of n-GaAs as having a thickness of about 150 Å, a current-blocking layer 7 of $n-Al_{0.75}Ga_{0.25}As$ as having a thickness of about 5000 Å, and a surface-protective layer 12 of non-doped GaAs as having a thickness of about 400 Å.

In turn, the semiconductor substrate 2 thus formed with the semiconductor layers was removed from the MBE system, then covered with a photoresist film 14 on the surface-protective layer 12. The photoresist film 14 was patterned to form an opening defining a region dedicated to a stripe cavity 11, followed by the formation of the stripe cavity 11 having a width of about 1.5 μm using a sulfuric acid based etchant. The etching with use of this sulfuric acid based etchant was performed to such an extent that the current-blocking layer was retained as having an appropriate thickness since this etchant was capable of etching both the surface-protective layer 12 of GaAs and the current-blocking layer 7 of Al$_{0.75}$Ga$_{0.25}$As. In succession thereto the current-blocking layer 7 thus retained in the stripe cavity 11 was completely removed by etching using a hydrofluoric acid based selective etchant (the etch rate thereof was almost 0 Å/sec against AlGaAs having an Al proportion of 0.2 or less).

The thus processed semiconductor substrate 2 was placed within the MBE apparatus again and then heated at about 740° C. for about 10 min., with the result that the etch stop layer 6 of GaAs which was exposed in the stripe cavity 11 was evaporated to expose the first upper clad layer 5 in the cavity 11. The respective surfaces of the first upper clad layer 5 and current-blocking layer 7 which were exposed by this evaporation process were not oxidized or contaminated since this process was performed in the MBE apparatus.

Finally, the temperature of the thus processed semiconductor substrate 2 being set at about 600° C., a second upper clad layer 8 of p-Al$_{0.6}$Ga$_{0.4}$As and a contact layer 9 of p-GaAs were sequentially deposited on the semiconductor substrate 2 by the MBE apparatus. The resulting structure was lapped, then formed with electrodes to complete a semiconductor laser device.

As described above, the provision of the etch stop layer allows the current-blocking layer to be precisely controlled, thereby forming the stripe cavity precisely. In addition, since the GaAs etch stop layer retained in the stripe cavity after etching is removed by evaporation in the MBE apparatus, the first clad layer exposed by such evaporation will never be oxidized.

As has been described, the process for fabricating a semiconductor laser device according to the present invention achieves a precise control of the depth of etching for the formation of the stripe cavity by means of the etch stop layer of GaAs. Further, since the GaAs layer retained in the stripe cavity is evaporated within the MBE apparatus, the first upper clad layer exposed by such evaporation will never be oxidized. Thus, the process of the present invention assures the production of a highly reliable semiconductor laser device capable of operating at a low current with an increased yield.

While only certain presently preferred embodiments have been described in detail, as will be apparent with those familiar with the art, certain changes and modifications can be made without departing from the spirit and scope of the invention as defined in the following claims.

What is claimed is:

1. A process for fabricating a semiconductor laser device, comprising the steps of:
   (a) forming a lower clad layer of a first conductivity type on a semiconductor substrate of the first conductivity type;
   (b) forming an active layer on the lower clad layer, the active layer being made of a material larger in refractive index and smaller in forbidden band width than the lower clad layer;
   (c) forming a first upper clad layer of a second conductivity type on the active layer, the first upper clad layer being made of a material smaller in refractive index and larger in forbidden band width than the active layer;
   (d) forming an etch stop layer made of GaAs on the first upper clad layer;
   (e) forming a current-blocking layer of the first conductivity type on the etch stop layer, the current-blocking layer being made of a material smaller in refractive index and larger in forbidden band width than the first upper clad layer;
   (f) forming a stripe cavity by etching at least a portion of the current-blocking layer down to the etch stop layer;
   (g) evaporating the etch stop layer remaining in the stripe cavity;
   (h) forming a second upper clad layer of the second conductivity type on the current blocking layer and the stripe cavity, the second upper clad layer being made of a material smaller in refractive index and larger in forbidden band width than the active layer while larger in refractive index and smaller in forbidden band width than the current-blocking layer; and
   (i) forming a contact layer of the second conductivity type on the second upper clad layer, the contact layer being made of a material larger in refractive index and smaller in forbidden band width than the active layer.

2. The process for fabricating a semiconductor laser device of claim 1, wherein said etch stop layer is perforated in a MBE apparatus.

3. The process for fabricating a semiconductor laser device of claim 1, wherein said first upper clad layer is made of Al$_x$Ga$_{1-x}$As ($0.35 \leq x \leq 0.7$), said etch stop layer is made of GaAs, said current blacking layer is made of Al$_z$Ga$_{1-z}$As ($z > x$, $0.45 \leq z \leq 0.8$).

4. The process for fabricating a semiconductor laser device of claim 1, further including a step of forming a surface-protective layer prior to be etched after forming said current blocking layer.

5. The process for fabricating a semiconductor laser device of claim 4, wherein said surface-protective is made of the same material as said current blocking layer.

6. The process for fabricating a semiconductor laser device of claim 1, wherein said first upper clad layer is made of Al$_x$Ga$_{1-x}$As ($0.35 \leq x \leq 0.7$), said etch stop layer is made of GaAs, said current blacking layer is made of Al$_z$Ga$_{1-z}$As ($z > x$, $0.45 \leq z \leq 0.8$), wherein said surface protective layer is made of GaAs.

7. The process for fabricating a semiconductor laser device of claim 4, wherein said surface protective layer is completely evaporated when said etch stop layer is evaporated.

* * * * *